United States Patent
Shin et al.

(10) Patent No.: US 11,209,502 B2
(45) Date of Patent: Dec. 28, 2021

(54) SYSTEM FOR OBJECT POSITION ESTIMATION BASED ON MAGNETIC FIELD SIGNAL USING UNDERWATER SENSOR NETWORK AND METHOD THEREOF

(71) Applicant: Foundation of Soongsil University-Industry Cooperation, Seoul (KR)

(72) Inventors: Yo An Shin, Seoul (KR); Kwang Yul Kim, Seoul (KR)

(73) Assignee: Foundation of Soongsil University-Industry Cooperation, Seoul (KR)

(*) Notice: Subject to any disclaimer, the term of this patent is extended or adjusted under 35 U.S.C. 154(b) by 583 days.

(21) Appl. No.: 16/260,068

(22) Filed: Jan. 28, 2019

(65) Prior Publication Data
US 2019/0250219 A1 Aug. 15, 2019

(30) Foreign Application Priority Data
Feb. 14, 2018 (KR) .......... 10-2018-0018465
Jul. 30, 2018 (KR) .......... 10-2018-0088701

(51) Int. Cl.
*G01R 33/00* (2006.01)
*G01R 33/02* (2006.01)
*G01C 21/04* (2006.01)

(52) U.S. Cl.
CPC ......... *G01R 33/0094* (2013.01); *G01C 21/04* (2013.01); *G01R 33/02* (2013.01)

(58) Field of Classification Search
CPC .... G01R 33/0094; G01R 33/02; G01C 21/04; G01C 21/20
See application file for complete search history.

(56) References Cited

U.S. PATENT DOCUMENTS

| 6,539,327 | B1* | 3/2003 | Dassot | G01V 3/081 702/150 |
| 2016/0291156 | A1* | 10/2016 | Hjelmstad | G01S 7/499 |
| 2018/0329075 | A1* | 11/2018 | Wu | G01S 19/47 |

FOREIGN PATENT DOCUMENTS

KR 10-1802872 B1 11/2017

* cited by examiner

*Primary Examiner* — Alvaro E Fortich
(74) *Attorney, Agent, or Firm* — Revolution IP, PLLC

(57) ABSTRACT

A method for object position estimation based on a magnetic field using an underwater sensor network, includes: step of receiving a magnetic field signal that is emitted from an underwater moving object using an underwater sensor network which is configured with a plurality of magnetic field sensors in the water; step of extracting an induced magnetic field signal by removing a geomagnetic field and a noise signal from the received magnetic field signal; step of determining whether or not the moving object enters the underwater sensor network using the induced magnetic field signal; and step of estimating a position of the object using position information of the plurality of sensors that sense the object if it is determined that the object enters the underwater sensor network.

10 Claims, 5 Drawing Sheets

[FIG. 1]
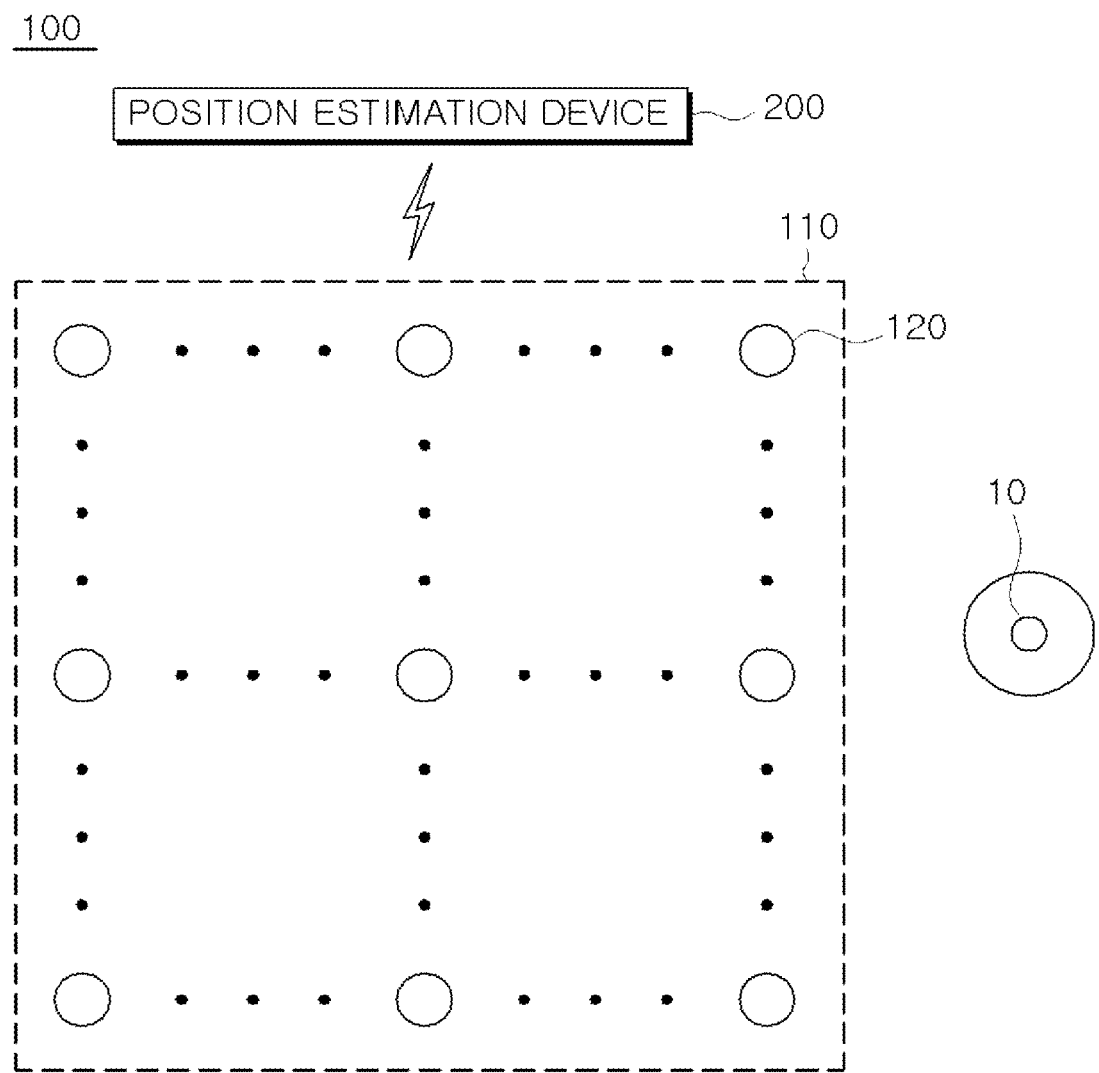

[FIG. 2]
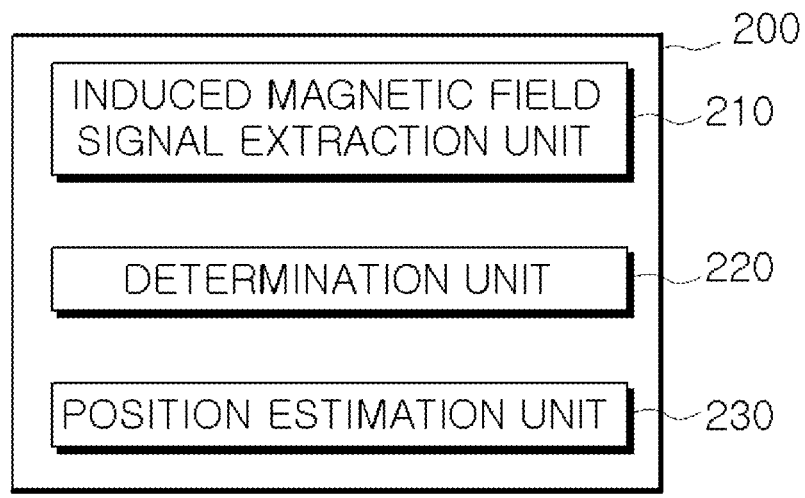
[FIG. 3]
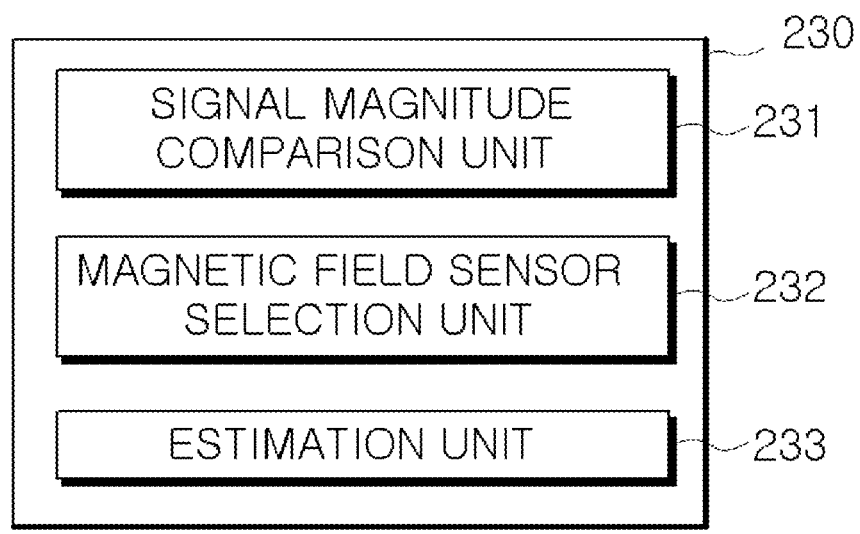

[FIG. 4]
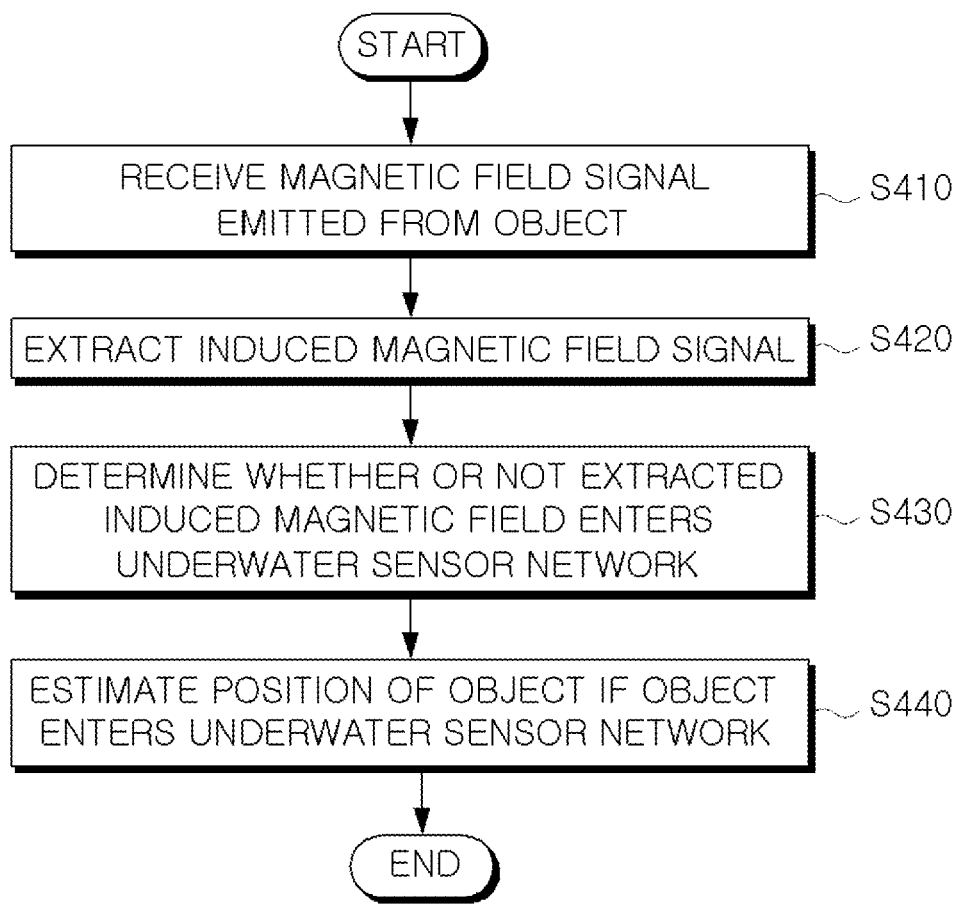

[FIG. 5]
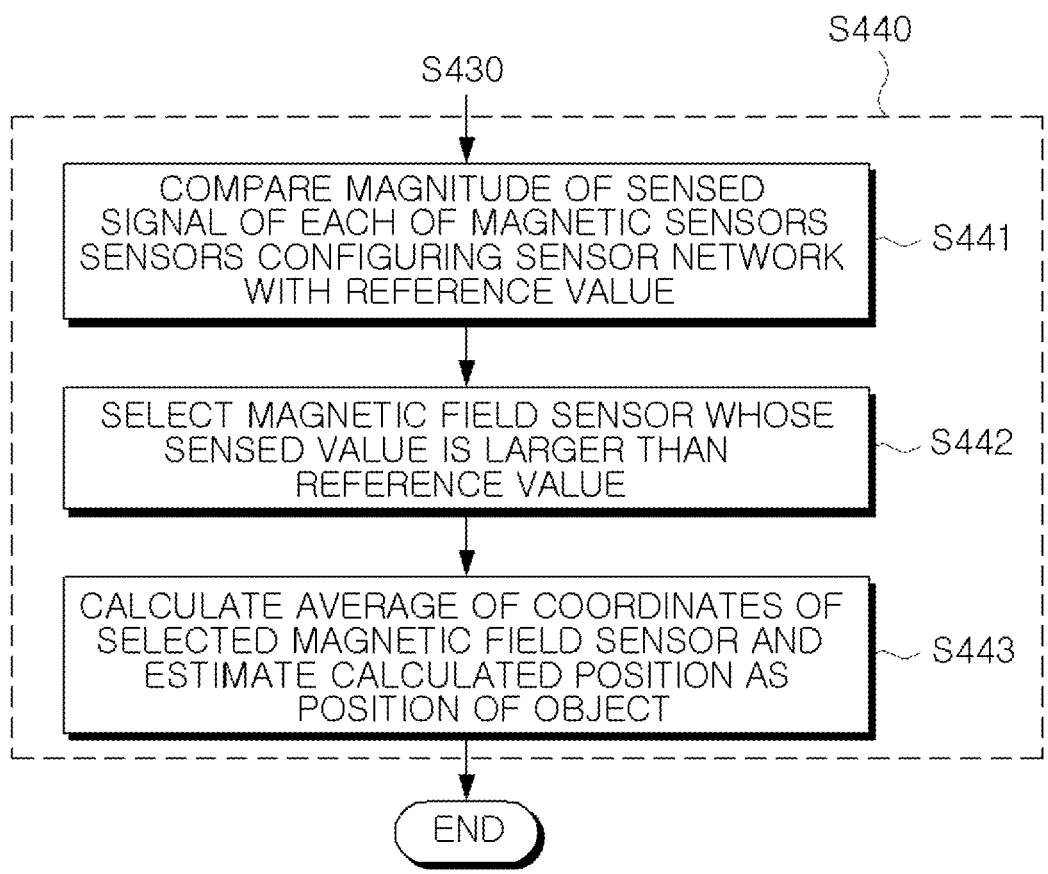

[FIG. 6]
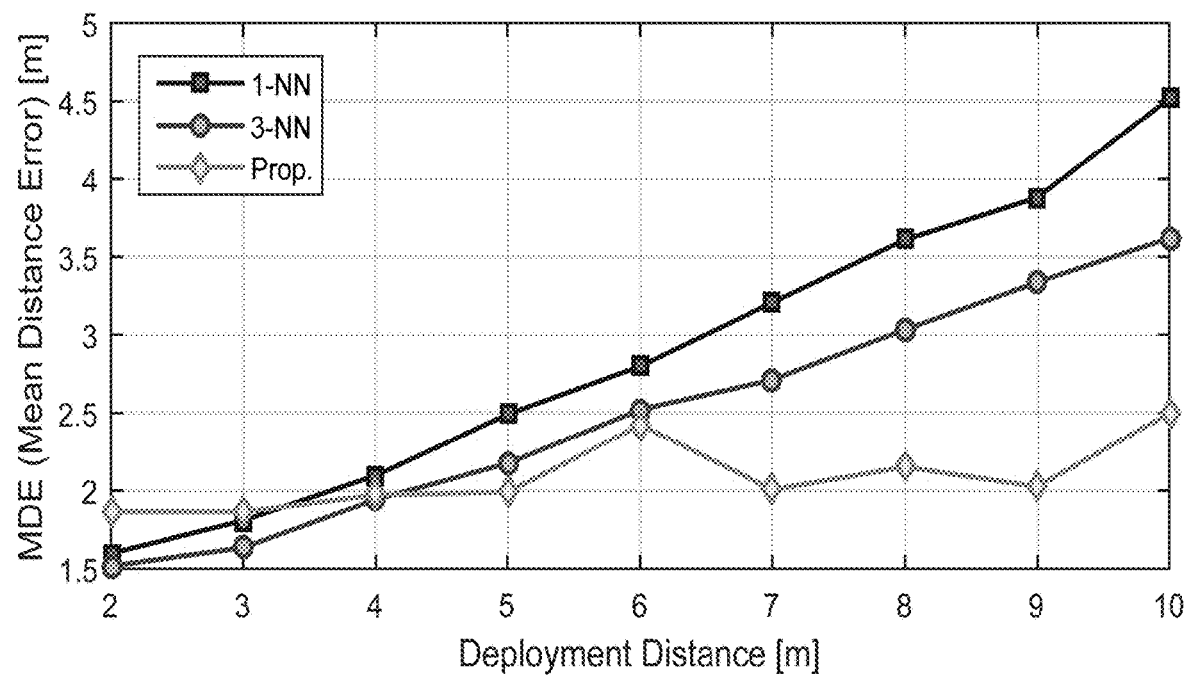

SYSTEM FOR OBJECT POSITION ESTIMATION BASED ON MAGNETIC FIELD SIGNAL USING UNDERWATER SENSOR NETWORK AND METHOD THEREOF

CROSS-REFERENCE TO RELATED APPLICATION

This application claims priority to and the benefit of Korean Patent Application No. 10-2018-0088701 filed in the Korean Intellectual Property Office on Jul. 30, 2018 and Korean Patent Application No. 10-2018-0018465 filed in the Korean Intellectual Property Office on Feb. 14, 2018, the entire contents of which are incorporated herein by reference.

BACKGROUND OF THE INVENTION

(a) Field of the Invention

The present invention relates to a system for object position estimation based on a magnetic field signal using an underwater sensor network and a method thereof, and more specifically, to a system for object position estimation, which measures a position of an object by using an object-specific magnetic field, based on a magnetic field signal using an underwater sensor network and a method thereof.

(b) Description of the Related Art

The Internet of underwater things (IoUT) is a technology of enabling a variety of underwater information to be viewed from the ground. In order to use the Internet of Underwater Things, it is necessary to be able to estimate not only communication between underwater sensor networks but also a position of an underwater moving node (UMN).

Since a radio frequency signal is rapidly absorbed in underwater environments, a global positioning system (GPS) which provides position information on the ground cannot be used. Due to this, a time-of-arrival (ToA) technique is used to measure reciprocal time of an acoustic signal, but the propagation speed of underwater sound is greatly affected by a change in water temperature and water pressure in addition to a flow of submarine water, and thus, there is a disadvantage that it is impossible to estimate a highly accurate position.

In addition, a fingerprinting technique is a method of estimating a position by probabilistic modeling, stores information of noise and a surrounding environment in a radio map (RM) and estimates a position of a terminal using the information. This method consists of two steps of an offline and an online. The first offline step is to construct the RM by measuring a received signal strength (RSS) according to each sample point in a given environment through a local search. The second online step is to measure the RSS of signals transmitted from a plurality of access points (APs) to a random node as a fingerprinting vector value and to estimate a position with a minimum Euclidean distance between the measured RSS vector value and the RSS vector value between each sample point in the RM as a position of a random node.

However, a fingerprinting technique of related art has problem that it is difficult to use in water because the position is measured by using radio waves.

In addition, in order to solve the problem of the fingerprinting technique, a technique for confirming an underwater position by using a magnetic field signal is required, but since the magnetic field signal has no characteristic of propagating differently from an underwater acoustic signal, the ToA technique cannot be used, and if a position of a sensor that detects a magnetic field is simply estimated as a position of an object, a great position estimation error occurs.

In particular, if too many anchor nodes are used in the position estimation process to improve a position estimation performance in the sensor network, a computational complexity of a system can be increased, and thus, a real time position estimation may be difficult. Meanwhile, if a small number of anchor nodes are used, there is a disadvantage that a great position estimation error according to a separation distance between the sensor nodes occurs.

A technology underlying the present invention is disclosed in Korean Patent No. 10-1802872 (published on Nov. 29, 2017).

SUMMARY OF THE INVENTION

An object to be solved by the present invention is to provide a system for object position estimation, which measures a position of an object by using an object-specific magnetic field, based on a magnetic field signal using an underwater sensor network and a method thereof.

According to an embodiment of the present invention, a method for object position estimation based on a magnetic field using an underwater sensor network includes step of receiving a magnetic field signal that is emitted from an underwater moving object using an underwater sensor network which is configured with a plurality of magnetic field sensors in the water, step of extracting an induced magnetic field signal by removing a geomagnetic field and a noise signal from the received magnetic field signal, step of determining whether or not the moving object enters the underwater sensor network using the induced magnetic field signal, and step of estimating a position of the object using position information of the plurality of sensors that sense the object if it is determined that the object enters the underwater sensor network.

in the step of estimating the induced magnetic field signal, the induced magnetic field signal may be extracted by removing the geomagnetic field and the noise signal using a single exponential smoothing (SES) algorithm or a double exponential smoothing (DES) algorithm.

in the step of determining whether or not the moving object enters the underwater sensor network, if the induced magnetic field signal is smaller than a threshold value, it may be determined that the object does not enter the underwater sensor network, and if the induced magnetic field signal is larger than or equal to the threshold value, it may be determined that the object enters the underwater sensor network as represented by the following equation, $$P = 0, \text{ if } \frac{1}{N}\sum_{n=1}^{N} Y_n(t) \leq T_h$$

$$P = 1, \text{ if } \frac{1}{N}\sum_{n=1}^{N} Y_n(t) > T_h$$

here, N is the number of all the magnetic field sensors configuring the underwater sensor network, $Y_n(t)$ is a magnitude of a signal that is received by an nth magnetic field sensor at a point of time t, $T_h$ is a threshold value for determining whether or not the object enters underwater sensor network, P=0 means that the object does not enter the underwater sensor network, and P=1 means that the object enters the underwater sensor network.

the threshold value $T_h$ may be set to a value that increases as a degree of ferromagneticity of the object increases.

the step of estimating the position of the object may include step of comparing a magnitude of the induced magnetic field signal that is obtained by measuring each of the N magnetic field sensors configuring the underwater sensor network with a threshold value, step of selecting k magnetic field sensors in which the measured induced magnetic field signal is larger than the threshold value, and step of calculating an average value of coordinates of the selected k magnetic field sensors and estimating an average value of the calculated coordinates as the position of the object.

According to another embodiment, a system for object position estimation based on a magnetic field using an underwater sensor network includes an underwater sensor network that is configured with a plurality of magnetic field sensors that receive a magnetic field signal which is emitted from an underwater moving object, and a position estimation device that extracts an induced magnetic field signal by removing a geomagnetic field and a noise signal from the received magnetic field signal, determines whether or not the moving object enters the underwater sensor network using the extracted induced magnetic field signal, and estimates a position of the object using position information of the plurality of sensors that sense the object.

Effects of the Invention

According to the present invention, it is possible to more accurately measure a position of an underwater moving object than a fingerprinting technique or a ToA technique that tracks an existing position, and to measure the position of the object even if a distance between respective sensors is increased by selecting the number of k sensors in accordance with the magnetic field signal to be measured and estimating the position, even in a situation in which a magnetic field strength of the object changes.

In addition, even if a distance between underwater sensors increases, an error between the measured object position and an actual object position can be reduced to be smaller than that of a fingerprinting technique of related art or the ToA technique.

BRIEF DESCRIPTION OF THE DRAWINGS

FIG. 1 is a diagram illustrating a system for object position estimation based on a magnetic field according to an embodiment of the present invention.

FIG. 2 is a configuration diagram illustrating a configuration of a position estimation device according to the embodiment of the present invention.

FIG. 3 is a configuration diagram illustrating a configuration of a position estimation unit of FIG. 2.

FIG. 4 is a flowchart illustrating an object position estimation method based on a magnetic field according to the embodiment of the present invention.

FIG. 5 is a flow chart specifically illustrating step S440 according to the embodiment of the present invention.

FIG. 6 is a graph illustrating results of measuring MDE according to an interval of an underwater sensor network according to the embodiment of the present invention.

DETAILED DESCRIPTION OF THE INVENTION

Hereinafter, embodiments of the present invention will be described in detail with reference to the accompanying drawings such that a person skilled in the art to which the present invention belongs can perform easily the embodiments. The present invention can be embodied in many different forms and is not limited to the embodiments described herein. In order to clearly describe the present invention, parts not related to the description are omitted, and a similar unit is denoted by a similar reference numeral throughout the specification.

Throughout the specification, when it is described that a unit includes an element, it means that the unit can further include other elements, rather than excluding other elements unless specifically described otherwise.

Hereinafter, embodiments of the present invention will be described in detail with reference to the accompanying drawings such that a person skilled in the art to which the present invention belongs can easily perform the embodiments.

FIG. 1 is a diagram illustrating an object position estimation system according to an embodiment of the present invention.

As illustrated in FIG. 1, a position estimation system 100 includes an underwater sensor network 110 and a position estimation device 200.

First, the underwater sensor network 110 includes a plurality of magnetic field sensors 120 spaced apart at predetermined intervals, and the magnetic field sensor 120 receives a magnetic field signal emitted from an underwater moving object 10.

At this time, the moving object 10 has ferromagneticity, and a degree of ferromagneticity is changed depending on a size or a configuration element of the object.

Here, the ferromagneticity means a property of magnetizing itself to become a magnet even in a state in which no magnetic field is applied from the outside of a material, and most objects have ferromagneticity.

In addition, the magnetic field sensor 120 includes a geomagnetic sensor and measures a magnitude of a magnetic field generated in the earth. Signals measured by the magnetic field sensor 120 include an induced magnetic field signal of the object, a geomagnetic field signal, and noise of a sensor in a broad sense.

FIG. 2 is a configuration diagram illustrating a configuration of a position estimation device according to the embodiment of the present invention.

As illustrated in FIG. 2, the position estimation device 200 includes an induced magnetic field signal extraction unit 210, a determination unit 220, and a position estimation unit 230.

First, the induced magnetic field signal extraction unit 210 removes a geomagnetic field and a noise signal from a magnetic field signal measured by the magnetic field sensor 120 by using a single exponential smoothing (SES) algorithm or a double exponential smoothing (DES) algorithm and extracts an induced magnetic field signal.

That is, the SES algorithm and the DES algorithm are used to acquire an induced magnetic field signal from the measured magnetic field signal.

Here, the SES algorithm includes a method of giving a large weight value to a recent observation point and reducing the weight value as going backward in time and is an algorithm that is used when there is no trend value or seasonality. The seasonality refers to fluctuations that occur regularly.

In addition, the DES algorithm is an algorithm that is used when there is the trend value in time series data, and a result value is derived by applying the SES algorithm twice.

Meanwhile, the induced magnetic field extracted by using the SES algorithm and the DES algorithm decreases as a distance from an object increases.

Next, the determination unit 220 determines whether or not the moving object 10 enters the underwater sensor network 110 using the induced magnetic field extracted from the induced magnetic field signal extraction unit 210.

If the extracted induced magnetic field signal is smaller than or equal to the measured threshold value, the determination unit 220 determines that the moving object does not enter the underwater sensor network 110. If the extracted induced magnetic field signal is larger than the measured threshold value, the determination unit 220 determines that the moving object enters the underwater sensor network 110.

Here, the threshold value is a value that can fluctuates depending on the degree of ferromagneticity of the moving object 10.

Next, if the determination unit 220 determines that the moving object 10 enters the underwater sensor network 110, the position estimation unit 230 estimates a position of the object by using position information of the plurality of the magnetic field sensors 120 that sense the moving object 10.

FIG. 3 is a configuration diagram illustrating a configuration of the position estimation unit illustrated in FIG. 2.

As illustrated in FIG. 3, the position estimation unit 230 includes a signal magnitude comparison unit 231, a magnetic field sensor selection unit 232, and an estimation unit 233.

First, the signal magnitude comparison unit 231 compares a magnitude of an induced magnetic field signal obtained by measuring each of the N magnetic field sensors 120 configuring the underwater sensor network 100 with a threshold value of the moving object 10.

Next, the magnetic field sensor selection unit 232 selects the magnetic field sensor 120 whose magnitude of the measured induced magnetic field signal is larger than the threshold value.

Then, the estimation unit 233 calculates an average value of coordinates of the magnetic field sensor 120 selected by the magnetic field sensor selection unit 232 and estimates the calculated average value as a position of the moving object 10.

Hereinafter, a object position estimation method based on a magnetic field according to the embodiment of the present invention will be described with reference to FIGS. 4 and 5.

FIG. 4 is a flowchart illustrating the object position estimation method based on the magnetic field according to the embodiment of the present invention, and FIG. 5 is a flowchart illustrating step S440 according to the embodiment of the present invention in detail.

As illustrated in FIG. 4, each of the magnetic field sensors 120 configuring the sensor network 110 installed in water first receives a magnetic field signal emitted from the moving object 10 (S410).

Here, the received signal includes a geomagnetic field signal, a noise signal of the moving object 10, and an induced magnetic field signal.

Then, the induced magnetic field signal extraction unit 210 extracts the induced magnetic field signal by removing the geomagnetic field signal and the noise signal of the magnetic field sensor 120 from the received magnetic field signal (S420).

At this time, the induced magnetic field signal extraction unit 210 can extract the induced magnetic field signal by removing the geomagnetic field signal and the noise signal using the SES algorithm or the DES algorithm to improve the accuracy.

Next, the determination unit 220 determines whether or not the extracted induced magnetic field enters the underwater sensor network 110 (S430).

That is, the determination unit 220 determines whether or not the moving object 10 enters the underwater sensor network using Equation 1 below.

$$P = 0, \text{ if } \frac{1}{N}\sum_{n=1}^{N} Y_n(t) \leq T_h \quad \text{[Equation 1]}$$

$$P = 1, \text{ if } \frac{1}{N}\sum_{n=1}^{N} Y_n(t) > T_h$$

Here, N is the number of all the magnetic field sensors configuring the underwater sensor network, $Y_n(t)$ is a magnitude of a signal received by the nth magnetic field sensor at a point of time t, $T_h$ is a threshold value for determining whether or not the object 10 enters the underwater sensor network, P=0 means that the object 10 does not enter the underwater sensor network 110, and P=1 means that the object 10 enters the underwater sensor network 110.

For example, assuming that N is 100 and a value of $T_h$ is 10, if a value of $Y_n(t)$ is smaller than or equal to 10, the determination unit 220 determines that the moving object 10 does not enter the sensor network 110.

In contrast to this, if an average of the values of $Y_n(t)$ is larger than 10, the determination unit 220 determines that the moving object 10 enters the sensor network 110.

Next, if it is determined that the moving object 10 enters the sensor network 110, the position estimation unit 230 estimates a position of the moving object 10 by using position information of the plurality of magnetic field sensors 120 that sense the object (S440).

That is, if the determination unit 220 determines that the moving object 10 enters the sensor network 110, the position estimation unit 230 tracks the position of the moving object 10, and if the determination unit 220 determines that the moving object 10 does not enter the sensor network 110, the position estimation unit 230 does not track the position of the moving object 10.

Hereinafter, step S440 will be described in detail with reference to FIG. 5.

First, the signal magnitude comparison unit 231 compares a magnitude of the magnetic field signal extracted from each of the N magnetic field sensors 120 configuring the underwater sensor network 110 (S441) with the threshold value.

Here, the signal magnitude comparison unit 231 compares a magnitude of the magnetic field extracted from each of the magnetic field sensors 120 configuring the underwater sensor network 110 with the threshold value.

In addition, the number of magnetic field sensors 120 can vary depending on a distance between the respective sensors and a size of an area to be measured.

Next, the magnetic field sensor selection unit 232 selects the magnetic field sensor 120 whose magnitude of the induced magnetic field signal compared by the signal magnitude comparison unit 231 is larger than the threshold value (S442).

Then, the estimation unit 233 calculates an average of coordinates of the magnetic field sensor 120 selected by the magnetic field sensor selection unit 232 and estimates the calculated position as a position of the object (S443).

In addition, the estimation unit 233 can continuously estimate the position of the moving object 10 and obtain a moving speed, a magnitude, and estimated position coordinates of the moving object 10 by using the estimated data.

FIG. 6 is a graph illustrating results of measurement of an MDE according to an interval of an underwater sensor network according to the embodiment of the present invention.

As illustrated in FIG. 6, 1-NN (Nearest Neighbor) and 3-NN are results of simulation using a radio positioning algorithm based on the existing received signal strength (RSS), and estimation results obtained by averaging positions of the fixed k (={1, 3}) sensors which receive the largest magnetic field signal, and Prop illustrates result of simulation according to the embodiment of the present invention.

Here, in order to measure a mean distance error (hereinafter, referred to as "MDE"), dipole moments are set to {54, 28.3, 88.6} [Am$^2$], AWGN is set to $\sigma^2$ [nT], an interval between the magnetic field sensors is set to 2 to 10 [m], and observation time is set to 200 [s].

In addition, the MDE represents a difference between the position of the actual object 10 and the measured position, and a Deployment Distance represents a disposition interval of the magnetic field sensor 120.

In FIG. 6, 1-NN represents one position of the magnetic field sensor 120 closest to the moving object 10, and 3-NN represents an average position of the three magnetic field sensors 120 closest to the moving object 10.

According to the graph of 1-NN and 3-NN algorithms illustrated in FIG. 6, if the distance between the magnetic field sensors 120 increases, the calculated MDE also increases, but in the present invention, it can be seen that an MDE value is maintained at a lower value than the 1-NN and 3-NN algorithms.

As described above, according to the present invention, it is possible to more accurately measure a position of an underwater moving object than a fingerprinting technique or a ToA technique that tracks a current position, and since a magnetic field characteristic is used, the position of the object can be accurately measured, even if a distance of each sensor increases, by selecting the number of k sensors in accordance with a magnetic field signal even when a strength of a magnetic field of the object changes and estimating the position.

In addition, even if a distance between underwater sensors increases, an error between a measured object position and an actual object position can be reduced to be smaller than an error of the fingerprinting technique or the ToA technique of related art.

While the present invention is described with reference to exemplary embodiments illustrated in the drawings, the embodiments are merely examples, and it will be understood that those skilled in the art may make various changes and another equivalent embodiment from the embodiments. Accordingly, the true technical protection scope of the present invention should be determined by the technical idea of the appended claims.

DESCRIPTION OF SYMBOLS

| | |
|---|---|
| 10: object | 100: position estimation system |
| 110: underwater sensor network | 120: magnetic field sensor |
| 200: position estimation device extraction unit | 210: induced magnetic field signal |
| 220: determination unit | 230: position estimation unit |
| 231: signal magnitude comparison unit | 232: magnetic field sensor selection unit |
| 233: estimation unit | |

What is claimed is:

1. A method for object position estimation based on a magnetic field using an underwater sensor network, comprising:

step of receiving a magnetic field signal that is emitted from an underwater moving object using the underwater sensor network which is configured with a plurality of magnetic field sensors in the water;

step of extracting an induced magnetic field signal by removing a geomagnetic field and a noise signal from the received magnetic field signal;

step of determining whether or not the underwater moving object enters the underwater sensor network using the induced magnetic field signal; and step of estimating a position of the underwater moving object using position information of the plurality of magnetic field sensors that sense the underwater moving object if it is determined that the underwater moving object enters the underwater sensor network.

2. The method for object position estimation based on a magnetic field according to claim 1, wherein, in the step of estimating the induced magnetic field signal, the induced magnetic field signal is extracted by removing the geomagnetic field and the noise signal using a single exponential smoothing (SES) algorithm or a double exponential smoothing (DES) algorithm.

3. The method for object position estimation based on a magnetic field according to claim 1, wherein, in the step of determining whether or not the underwater moving object enters the underwater sensor network, if the induced magnetic field signal is smaller than a threshold value, it is determined that the underwater moving object does not enter the underwater sensor network, and if the induced magnetic field signal is larger than or equal to the threshold value, it is determined that the underwater moving object enters the underwater sensor network as represented by the following equation:

$$P = 0, \text{ if } \frac{1}{N}\sum_{n=1}^{N} Y_n(t) \le T_h$$

$$P = 1, \text{ if } \frac{1}{N}\sum_{n=1}^{N} Y_n(t) > T_h$$

here, N is the number of all the magnetic field sensors configuring the underwater sensor network, $Y_n(t)$ is a magnitude of a signal that is received by an nth magnetic field sensor at a point of time t, $T_h$ is a threshold value for determining whether or not the underwater moving object enters underwater sensor network, P=0 means that the underwater moving object does not enter the underwater sensor network, and P=1 means that the underwater moving object enters the underwater sensor network.

4. The method for object position estimation based on a magnetic field according to claim 3,
wherein the threshold value Th is set to a value that increases as a degree of ferromagneticity of the underwater moving object increases.

5. The method for object position estimation based on a magnetic field according to claim 1,
wherein the step of estimating the position of the underwater moving object includes
step of comparing a magnitude of the induced magnetic field signal that is obtained by measuring each of the N magnetic field sensors configuring the underwater sensor network with a threshold value;
step of selecting k magnetic field sensors in which the measured induced magnetic field signal is larger than the threshold value; and
step of calculating an average value of coordinates of the selected k magnetic field sensors and estimating an average value of the calculated coordinates as the position of the underwater moving object.

6. A system for object position estimation based on a magnetic field using an underwater sensor network, comprising:
an underwater sensor network that is configured with a plurality of magnetic field sensors that receive a magnetic field signal which is emitted from an underwater moving object; and
a position estimation device that extracts an induced magnetic field signal by removing a geomagnetic field and a noise signal from the received magnetic field signal, determines whether or not the underwater moving object enters the underwater sensor network using the extracted induced magnetic field signal, and estimates a position of the underwater moving object using position information of the plurality of magnetic field sensors that sense the underwater moving object.

7. The system for object position estimation based on a magnetic field according to claim 6,
wherein the position estimation device includes
an induced magnetic field signal extraction unit that extracts the induced magnetic field signal using a single exponential smoothing (SES) algorithm or a double exponential smoothing (DES) algorithm by removing the geomagnetic field and the noise signal from the received magnetic field signal;
a determination unit that determines whether or not the underwater moving object enters the underwater sensor network using the extracted induced magnetic field signal; and
a position estimation unit that estimates the position of the underwater moving object using the position information of the plurality of sensors that sense the underwater moving object.

8. The system for object position estimation based on a magnetic field according to claim 6,
wherein the determination unit determines that the underwater moving object does not enter the underwater sensor network if the induced magnetic field signal is smaller than a threshold value, and determines that the underwater moving object enters the underwater sensor network as represented by the following equation if the induced magnetic field signal is larger than or equal to the threshold value:

$$P = 0, \text{ if } \frac{1}{N}\sum_{n=1}^{N} Y_n(t) \leq T_h$$

$$P = 1, \text{ if } \frac{1}{N}\sum_{n=1}^{N} Y_n(t) > T_h$$

here, N is the number of all the magnetic field sensors configuring the underwater sensor network, $Y_n(t)$ is a magnitude of a signal that is received by an nth magnetic field sensor at a point of time t, $T_h$ is a threshold value for determining whether or not the underwater moving object enters underwater sensor network, P=0 means that the underwater moving object does not enter the underwater sensor network, and P=1 means that the underwater moving object enters the underwater sensor network.

9. The system for object position estimation based on a magnetic field according to claim 8,
wherein the threshold value Th is set to a value that increases as a degree of ferromagneticity of the underwater moving object increases.

10. The system for object position estimation based on a magnetic field according to claim 6,
wherein the position estimation unit includes
a signal magnitude comparison unit that compares a magnitude of the induced magnetic field signal that is obtained by measuring each of the N magnetic field sensors configuring the underwater sensor network with a threshold value;
a magnetic field sensor selection unit that selects k magnetic field sensors in which the measured induced magnetic field signal is larger than the threshold value; and
an estimation unit that calculates an average value of coordinates of the selected k magnetic field sensors and estimates an average value of the calculated coordinates as the position of the underwater moving object.

* * * * *